(12) United States Patent
Stowell et al.

(10) Patent No.: US 10,812,020 B1
(45) Date of Patent: Oct. 20, 2020

(54) ENERGY EMITTER CONTROL CIRCUIT

(71) Applicant: Lyten, Inc., Sunnyvale, CA (US)

(72) Inventors: Michael W. Stowell, Sunnyvale, CA (US); Tung Van Pham, San Jose, CA (US)

(73) Assignee: Lyten, Inc., Sunnyvale, CA (US)

( * ) Notice: Subject to any disclaimer, the term of this patent is extended or adjusted under 35 U.S.C. 154(b) by 0 days.

(21) Appl. No.: 16/544,656

(22) Filed: Aug. 19, 2019

(51) Int. Cl.
| | |
|---|---|
| *H03B 9/10* | (2006.01) |
| *H03K 3/78* | (2006.01) |
| *H03K 3/57* | (2006.01) |
| *H03C 5/04* | (2006.01) |
| *H03L 5/02* | (2006.01) |
| *H01J 25/50* | (2006.01) |
| *H01J 37/32* | (2006.01) |
| *H03K 17/082* | (2006.01) |

(52) U.S. Cl.
CPC ............... *H03B 9/10* (2013.01); *H01J 25/50* (2013.01); *H01J 37/32201* (2013.01); *H03C 5/04* (2013.01); *H03K 3/57* (2013.01); *H03K 3/78* (2013.01); *H03K 17/082* (2013.01); *H03L 5/02* (2013.01)

(58) Field of Classification Search
CPC ... H03B 9/10; H03K 3/57; H03K 3/78; H03K 17/082; H03C 5/04; H03L 5/02; H03L 39/10; H01J 37/32201; H01J 25/50
USPC ...................................................... 315/39.51
See application file for complete search history.

(56) References Cited

U.S. PATENT DOCUMENTS

| | | | | |
|---|---|---|---|---|
| 5,307,079 | A | * | 4/1994 | Ross .................... H01Q 9/28 343/821 |
| 5,515,011 | A | | 5/1996 | Pasco |
| 6,340,912 | B1 | | 1/2002 | Gerstenberg et al. |
| 6,658,053 | B1 | * | 12/2003 | Aiello .................... H03K 7/10 326/87 |
| 6,914,556 | B1 | | 7/2005 | Nyswander |
| 7,102,110 | B2 | | 9/2006 | Shinohara |
| 2002/0067131 | A1 | * | 6/2002 | Nelson .................... G21H 1/02 315/1 |
| 2011/0006681 | A1 | * | 1/2011 | Preston .................. H01J 65/044 315/39 |
| 2013/0270110 | A1 | | 10/2013 | Sasai et al. |
| 2016/0073453 | A1 | * | 3/2016 | Hyde .................... H05B 6/705 219/745 |

FOREIGN PATENT DOCUMENTS

WO 2015193155 A1 12/2015

* cited by examiner

*Primary Examiner* — Don P Le
(74) *Attorney, Agent, or Firm* — Paradice & Li LLP

(57) ABSTRACT

Pulsed radiation is generated at a power level that depends on a voltage level, frequency and duty cycle of a pulsed high voltage. A pulsing switch generates the pulsed high voltage from a high voltage and a pulse control signal. The pulsing switch has first and second bi-polar active switches connected in series between a high voltage conductor and a ground conductor. The pulsed high voltage is produced at a connection between the first and second bi-polar active switches when the first and second bi-polar active switches are repeatedly pulsed on and off to alternatingly connect the high voltage conductor and the ground conductor to a pulsed voltage output.

15 Claims, 5 Drawing Sheets

ENERGY EMITTER CONTROL CIRCUIT

BACKGROUND

Microwave emitters typically produce microwave radiation through the use of a magnetron or other type of microwave energy source. To control the output power of the microwave radiation, a microwave emitter control circuit may pulse the microwave energy source at various frequencies and duty cycles. Each microwave emitter control circuit is designed for a specific range of pulsing frequency, duty cycle, shape, and output power level.

Various factors limit the operating range of any given pulsed microwave emitter control circuit design. The rise and fall times of the pulsing signal are examples of such factors that limit the pulsing frequency and duty cycle, since a slow rise or fall time can negatively impact the rate at which the signal can be switched. Additionally, the power that the circuit can deliver to the magnetron directly affects the output power level of the magnetron. The relative complexity and cost of microwave emitter control circuit designs are further considerations.

SUMMARY

In some embodiments, an electronic circuit is disclosed to control an energy source that generates pulsed radiation when receiving a pulsed high voltage. The electronic circuit includes a high voltage generator, a pulse generator, and a pulsing switch. The electronic circuit may be coupled to, for example, a microwave energy source that generates pulsed microwave radiation when receiving a pulsed high voltage, where a power level of the pulsed microwave radiation depends on a voltage level, a frequency, and a duty cycle of the pulsed high voltage. The high voltage generator produces a high voltage. The pulse generator produces a pulse control signal having a frequency and a duty cycle. The pulsing switch has a first bi-polar active switch, a second bi-polar active switch, a high voltage connection, a ground connection, a pulse input, and a pulsed high voltage output. The first bi-polar active switch and the second bi-polar active switch are connected in series between the high voltage connection and the ground connection. The high voltage connection is connected to the high voltage generator to receive the high voltage. The ground connection is connected to a ground potential. The pulsed high voltage output is connected between the first bi-polar active switch and the second bi-polar active switch. The pulse input is connected to the pulse generator to receive the pulse control signal. The pulsed high voltage is produced at the pulsed high voltage output when the first bi-polar active switch and the second bi-polar active switch are repeatedly pulsed on and off to alternatingly connect the pulsed high voltage output back and forth between the high voltage connection and the ground connection. The frequency and the duty cycle of the pulsed high voltage is based on the frequency and the duty cycle of the pulse control signal.

In some embodiments, a method includes generating a high voltage having a voltage level; generating a pulse control signal having a frequency and a duty cycle; generating, by a pulsing switch, a pulsed high voltage from the high voltage and the pulse control signal; and generating a pulsed microwave radiation having a power level that depends on the voltage level, the frequency and the duty cycle. The pulsed high voltage has the voltage level, the frequency and the duty cycle. The pulsing switch has a first bi-polar active switch, a second bi-polar active switch, a high voltage connection, a ground connection, a pulse input, and a pulsed high voltage output. The first bi-polar active switch and the second bi-polar active switch are connected in series between the high voltage connection and the ground connection. The high voltage connection receives the high voltage. The ground connection is connected to a ground potential. The pulsed high voltage output is connected between the first bi-polar active switch and the second bi-polar active switch. The pulse input receives the pulse control signal. The pulsed high voltage is produced at the pulsed high voltage output when the first bi-polar active switch and the second bi-polar active switch are repeatedly pulsed on and off to alternatingly connect the pulsed high voltage output back and forth between the high voltage connection and the ground connection.

In some embodiments, the pulsed high voltage has a rise time of 20-50 nanoseconds. In some embodiments, the pulsed high voltage has a fall time of 20-50 nanoseconds. In some embodiments, the pulsed microwave radiation is pulsed on and off according to the pulsed high voltage. In some embodiments, when the pulsed radiation is off, the energy source is held at a nonzero voltage level below an oscillating region. In some embodiments, the pulsed high voltage output is shunted to the ground connection through the second bi-polar active switch, the pulsed high voltage output being capable of collapsing a circulating electron cloud. In some embodiments, an electronic circuit includes a filament control circuit that provides a current to a filament of the energy source, where in further embodiments the power level of the pulsed radiation is controlled by adjusting the high voltage of the high voltage generator and by controlling the current to the filament. In some embodiments, the energy source is a magnetron, a klystron, or a traveling wave guide; and the energy source may be a microwave energy source.

DETAILED DESCRIPTION

Figure 1A:
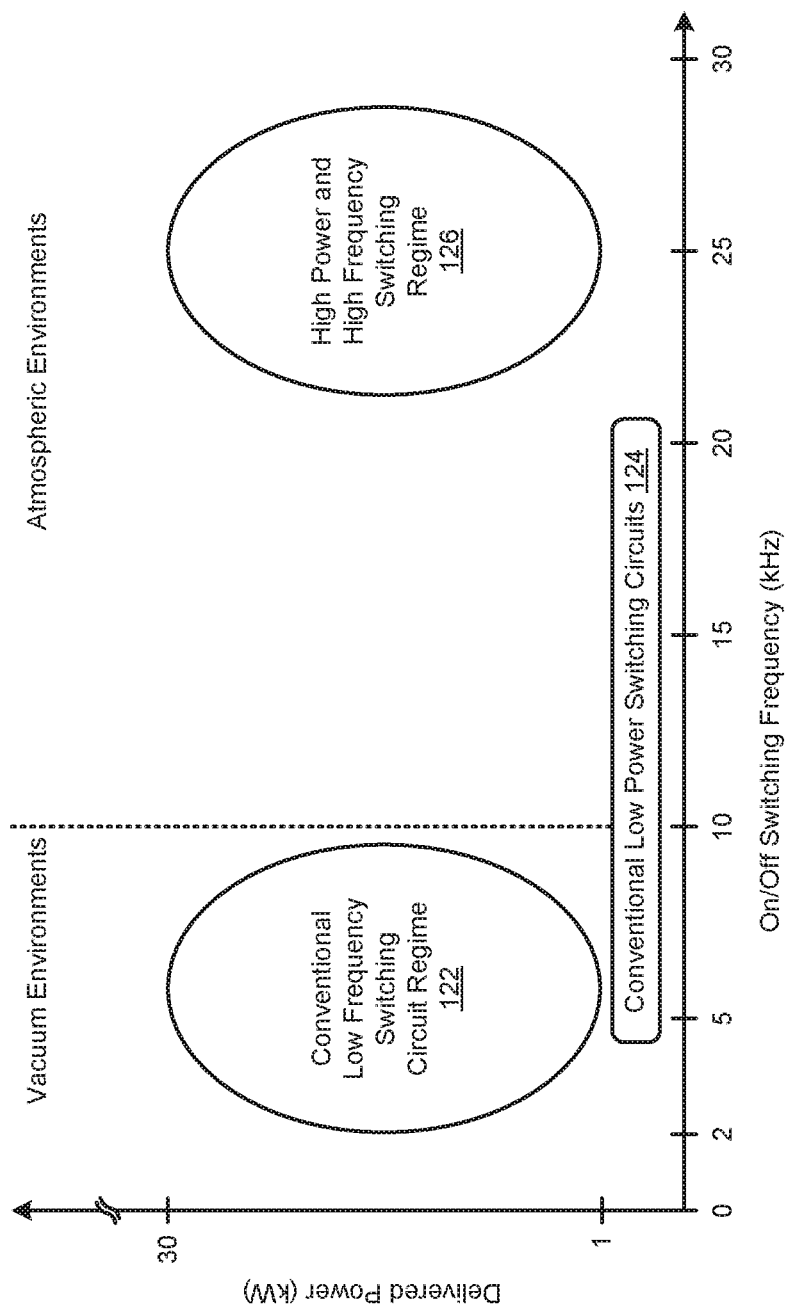
FIG. 1A depicts various domains where filament power is switched over wide ranges of power and where filament power is switched over wide ranges of switching frequencies.

Reference now will be made to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Microwave magnetrons have been in use in various applications since the earliest incarnations of magnetrons. A magnetron generates a tuned microwave signal by marshalling electrons that are emitted from a filament upon excitation from a direct current. The electrons are marshalled using a magnetic B-field that causes the emitted electrons to swirl over cavities in a magnetron ring. As the electrons swirl over the openings in the cavities, a microwave signal is emitted. The frequency of the microwave signal can be tuned over a range by varying the shape and size and juxtaposition of the cavities.

As such, the emitted microwave signal can be tuned (e.g., tuned for a power level, tuned for frequency, tuned for signal shape, etc.) to accommodate applications in many different fields. For example, an emitted microwave signal tuned to the resonant frequency of a water molecule can be used to heat water that is in food placed into a microwave oven. In a microwave oven application, the energy in the microwave signal is used for heating foods or beverages, and the power dissipated by heating the water is in the range of a few hundred watts. Controlled heating of foods is accomplished by pulsing the energy of the microwave signal. This pulsing facilitates slow and even heating (i.e., without drying out or burning the food) by (1) for a first controlled duration, turning on the direct current to the magnetron so as to apply energy to the food then (2) for a second controlled duration, turning off the direct current to the magnetron to allow the food to absorb (i.e., distribute) the energy through molecular vibration and rotation, thus transferring heat into the food being heated.

Microwave magnetrons are used in many other applications, some of which demand higher power and higher turn-on/turn-off rates. In some cases, these other applications demand very high power and very high turn-on/turn-off rates. Strictly as an example, when using a microwave magnetron to apply energy to a sample of a material to be annealed, the magnetron power needed to heat up the sample in a reasonable amount of time (e.g., a few minutes or less) is much higher (e.g., in the range of thousands of watts) than for heating food, and the turn-on/turn-off rate is much faster (e.g., in the 10 KHz to 25 KHz range).

In another example, when microwave magnetrons are used to generate plasma in a microwave plasma reactor, the energy needed to dissociate a process gas into ions is even higher (e.g., in the range of tens of thousands of watts) than for annealing materials, and the turn-on/turn-off rate needed to control the electron temperature is even faster (e.g., in the 25 KHz to 100 KHz range), depending on various factors. Generating a stable plasma plume of dissociated constituents of a process gas is very sensitive to the turn-on/turn-off rate and duty cycle. Moreover, generating a stable plasma plume in a process gas reactor is further complicated by the need to perform the dissociation in atmospheric (e.g., low cost) environments.

Unfortunately, power supplies that can deliver tens of thousands of watts of power do not quickly switch from "on" to "off" (or "off" to "on"). This inability to quickly switch from a high power "on" state to a low or zero power "off" limits the ability to finely tune or control the microwave signal. In turn, the inability to control the microwave signal limits the ability to control annealing and/or limits the ability to control the dynamics of dissociation of the process gas.

What is needed are techniques for controlling high power current to a filament such that that the high power and high frequency switching capability that is needed for controlling annealing processes and/or for controlling the dynamics of dissociation of the process gas can be achieved.

Note that although embodiments of electronic control circuits shall be described for use with microwave energy sources, the electronic circuits may be used with other frequencies, such as magnetron tubes of any frequency.

FIG. 1A presents various regimes where filament power is switched on and off over wide ranges of power and where filament power is switched over wide ranges of switching frequencies. The abscissa of the graph covers a switching frequency range from about 2 KHz to about 30 KHz. The ordinate of the graph covers a range from a few watts to over 30 KWatts. Further, a vacuum environment regime and an atmospheric environment regime are superimposed respectively onto the left side and the right side of the graph. Determining the regime for carrying out processes (i.e., choosing either the vacuum environment or the atmospheric environment) is based on the specific process or application. For example, the vacuum environment may be preferred for gas dissociation, for materials annealing, for materials deposition, for etching and for various functionalization purposes, whereas for generating a plasma or plasma radical, or for pyrolyzing, or for sintering, of for annealing, the atmospheric regime may be preferred.

As can be seen, the conventional low frequency switching circuit regime 122 extends only to about 10 KHz, and only in the vacuum regime. Also, as can be seen, the shown conventional low power switching circuits 124 extends only to about 20 KHz, whereas the high power and high frequency switching regime 126 covers a switching range from about 20 KHz and above.

As indicated hereinabove, what is needed is a way to control a high power current to a filament such that that the high power and high frequency switching capability used for controlling annealing and/or for controlling the dynamics of dissociation of the process gas can be achieved.

A microwave signal generation apparatus generally includes a magnetron or klystron, or traveling wave guide, or other microwave energy source. Electronic circuits control delivery of electrical power (e.g., direct current) to the microwave signal generation apparatus. Such electronic circuitry can be configured into two components: (1) a component to control high voltage electric power, and (2) a component to control pulsed delivery of electric power to a filament.

Figure 1B:
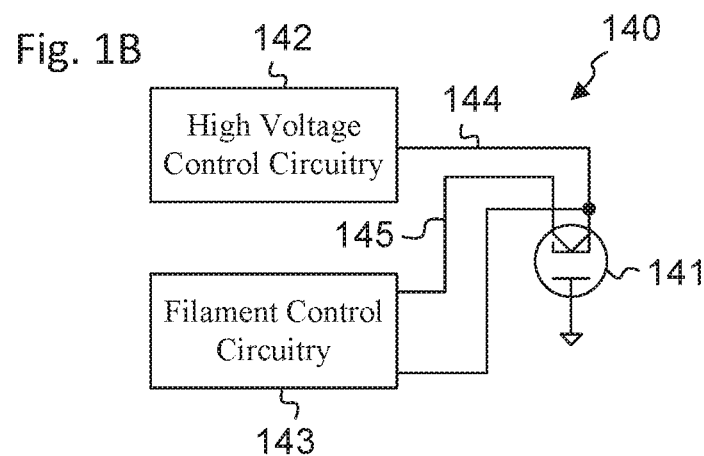
FIG. 1B shows a simplified schematic diagram of an example microwave emitter control circuit, in accordance with some embodiments.

As shown in FIG. 1B, a microwave emitter control circuit 140, in accordance with some embodiments, includes a magnetron or klystron, traveling wave guide, or other microwave energy source 141, high voltage control circuitry 142, and a filament control circuit 143, among other potential circuit components not shown for simplicity. The microwave emitter control circuit 140 is a relatively low-cost, low-complexity design that enables relatively fast rise and fall times for pulsing the microwave energy source 141 with a relatively broad range for the output power level. Furthermore, the microwave emitter control circuit 140 provides fine control of pulsing frequency as well as pulsing duty cycle for the pulsed microwave radiation generated by microwave energy source. The high voltage control circuitry 142 generally includes high voltage power electronics for generating a high voltage (a high voltage generator) and a pulsing switch (as described below with reference to FIG. 5) for generating a pulsed high voltage output 144 from the generated high voltage. The filament control circuit 143 generally includes a filament isolation transformer and an optional filament controller (as described below with reference to FIG. 5) for generating a filament current at 145. The pulsed high voltage output 144 is applied to high voltage components of the microwave energy source 141, and the filament current at 145 is applied to a filament of the microwave energy source 141; thereby causing the microwave energy source 141 to generate or emit microwave radiation (e.g., at about 915 MHz, or at or about 2.45 GHz or at or about 5.8 GHz). Additionally, the pulsing nature of the pulsed high voltage output 144 pulses or switches the microwave energy source 141 on and off, or between a high power level and a low power level; thereby causing the microwave energy source 141 to intermittently generate or emit the microwave radiation as it is pulsed on and off.

The on/off pulsing of the microwave energy source 141 (and thus of the emitted microwave radiation) is done at an operating power level, pulsing frequency, and pulsing duty cycle that generally depend on the particular application of the microwave emitter control circuit 140. Additionally, the on/off pulsing of the microwave energy source 141 (and thus of the emitted microwave radiation) is done with relatively fast rise and fall times that enable a relatively wide variety of combinations of different ranges for the operating power level, pulsing frequency, and pulsing duty cycle, which thus enable the use of the microwave emitter control circuit 140 in a variety of different applications (e.g., for generating a plasma or plasma radical, or for pyrolyzing, sintering, annealing, etc.) and/or that pertain to various types of materials. In some embodiments, the rise and fall times can be slowed, tuned or adjusted for specific applications with a rise time adjustment network circuit at the output of the high voltage control circuitry 142, as described below with respect to FIG. 6.

In general, the microwave emitter control circuit 140 enables a microwave radiation power level of about 100 watts to 250 kilowatts or from 250 kilowatts to about 500 kilowatts, or from about 500 kilowatts to 1 megawatt, a pulsing frequency of about 5 Hz to 100 kHz, and a pulsing duty cycle of about 5%-100%. More specific operating parameters generally depend on the particular application in which the microwave emitter control circuit 140 is being used. A non-limiting list of such applications may include pyrolyzing, cracking or converting of various types of gases or molecules, annealing of various types of materials, sintering of various types of materials, formation of nano-diamonds, formation of carbon nano-onions, and plasma-based material synthesis, etc. In some embodiments, the specific operating parameters also generally depend on the type of magnetron, klystron, traveling wave guide, or other microwave generating or other microwave energy source that the microwave emitter control circuit 140 controls.

Figure 2:
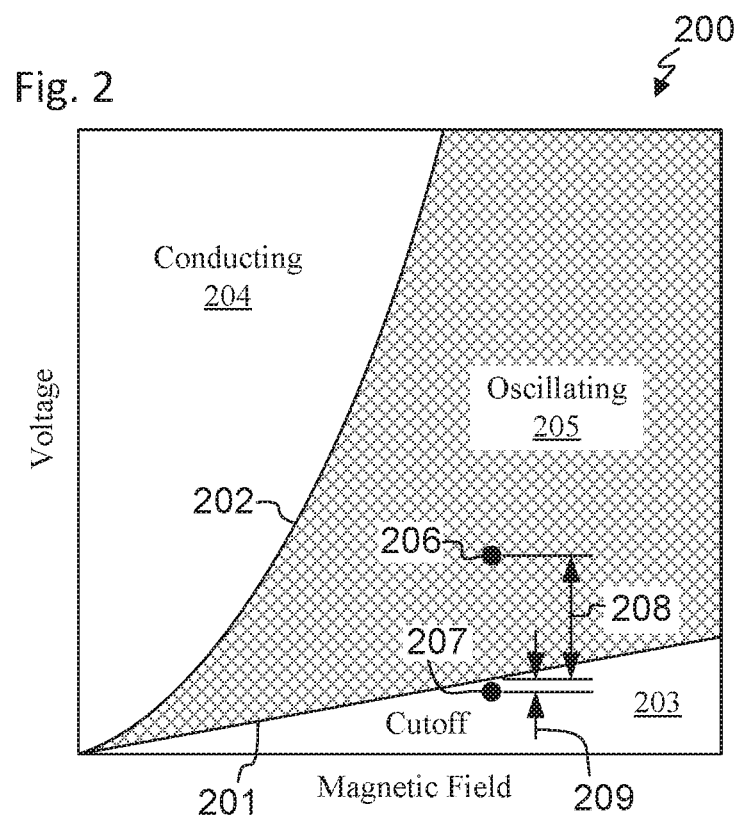
FIG. 2 shows a simplified graph of operating voltage versus magnetic field for a magnetron.

FIG. 2 provides an illustration for explaining at least part of the reasons why the microwave emitter control circuit 140 is capable of achieving the operating parameter ranges mentioned above. FIG. 2 shows a generalized characteristic graph 200 of the operating voltage versus magnetic field and its correspondence to electron cloud behavior for a typical magnetron. A lower line represents a "Hartree curve" 201, and an upper line represents a "Hull cutoff curve" 202. These characteristic curves 201 and 202 have different values for different magnetrons, so absolute values for units are not shown. However, an operating mode of any given magnetron broadly depends on the general position of the magnetron's operating voltage and magnetic field relative to the characteristic curves 201 and 202. For example, below the Hartree curve 201, the magnetron is generally in the cutoff region 203, wherein the magnetron is neither conducting nor oscillating, so it is not generating microwave radiation in the cutoff region 203. Above or to the left of the Hull cutoff curve 202, the magnetron is generally in the conducting region or mode 204, wherein current is flowing through the magnetron, but it is not oscillating, so it is not generating microwave radiation in this region 204. Between the Hartree curve 201 and the Hull cutoff curve 202, the magnetron is generally in the oscillating region 205, wherein the magnetron has current flow and is oscillating, so it is generating microwave radiation in this oscillating region 205, which is also referred to as the Hartree region. At different operating locations or points within the oscillating region 205, the magnetron generally operates with different power outputs and/or different efficiencies. For example, at an operating point within the oscillating region 205, but close to the Hartree curve 201, the magnetron is oscillating, but barely generating any microwave radiation. Further into the middle of the oscillating region 205, on the other hand, the magnetron generally produces appreciable levels of microwave radiation, depending on the overall operating power level.

In some embodiments, the microwave emitter control circuit 140 (FIG. 1B) operates in a manner such that the on/off cycling or pulsing of the microwave energy source 141 causes the microwave energy source 141 to cycle between "on" and "off" operating points 206 and 207, during an on-time and an off-time, respectively. The on point 206 is well above the Hartree curve 201 and substantially within the oscillating region 205, as generally indicated by dimension 208 relative to the Hartree curve 201, such that the microwave energy source 141 is oscillating and producing microwave radiation at a significant power level with a relatively high efficiency. The off point 207, of the other hand, is only slightly below the Hartree curve 201 and barely within the cutoff region 203 at a nonzero voltage level, as generally indicated by dimension 209 relative to the Hartree curve 201, such that the microwave energy source 141 is not oscillating or producing microwave radiation. However, power to the microwave energy source 141 is not fully turned off at the off point 207 due to the nonzero voltage level at which the operating voltage is held, even though the microwave energy source 141 output power is off at this point. Instead, some nonzero level of power or voltage is still applied to the microwave energy source 141 at the off point 207 during the off-time. That is, when the pulsed microwave radiation is off, methods include holding the microwave energy source at a nonzero voltage level below an oscillating region.

Maintaining this low level of power or voltage during the off-time allows for the magnetron to be rapidly returned to full-on operating power, such as at on point 206 within a very short time period (e.g., with a rise time of about 20 to about 50 nanoseconds). This concept of maintaining or holding the microwave energy source 141 only slightly outside and below the oscillating region 205 (i.e., slightly below the Hartree curve 201 or slightly within the cutoff region 203) is referred to herein as "simmering," wherein the microwave energy source 141 "simmers" at a power or voltage level just outside an "on" condition and from which it can be transitioned to a full-on level very rapidly. This technique can be used in some embodiments for pulse shaping of the pulsed microwave radiation. For example, the pulse shape could be triangular, trapezoidal, or smoothed out versions of triangular, trapezoidal or square pulses. The pulse shape can be controlled to a fine degree by the microwave emitter control circuit 140. For example, the pulse shape can be based on a set of desired properties of a plasma plume, which desired properties are in turn based on accommodation for a particular application (e.g., for pyrolyzing, sintering, annealing, etc.).

Maintaining the simmer power level of a microwave energy source during the off-time is distinguished from processes or systems that turn power to a microwave energy source completely off, since the time and power required to transition to an "on" point is considerably less when the microwave energy source can start from the simmer power level compared to when it has to start from the lower completely-off point. The ability to quickly transition from a simmering point to an "on" point enables high frequency pulsing of the microwave energy source. Additionally, this simmering technique is distinguished from processes or systems that keep a microwave energy source within the oscillating region 205. Furthermore, the faster rise times that are possible when using the herein-discussed simmering technique and the faster fall times that are possible when using the herein-discussed quenching technique help prevent arcs or instabilities from occurring in the plasma.

Figure 3:
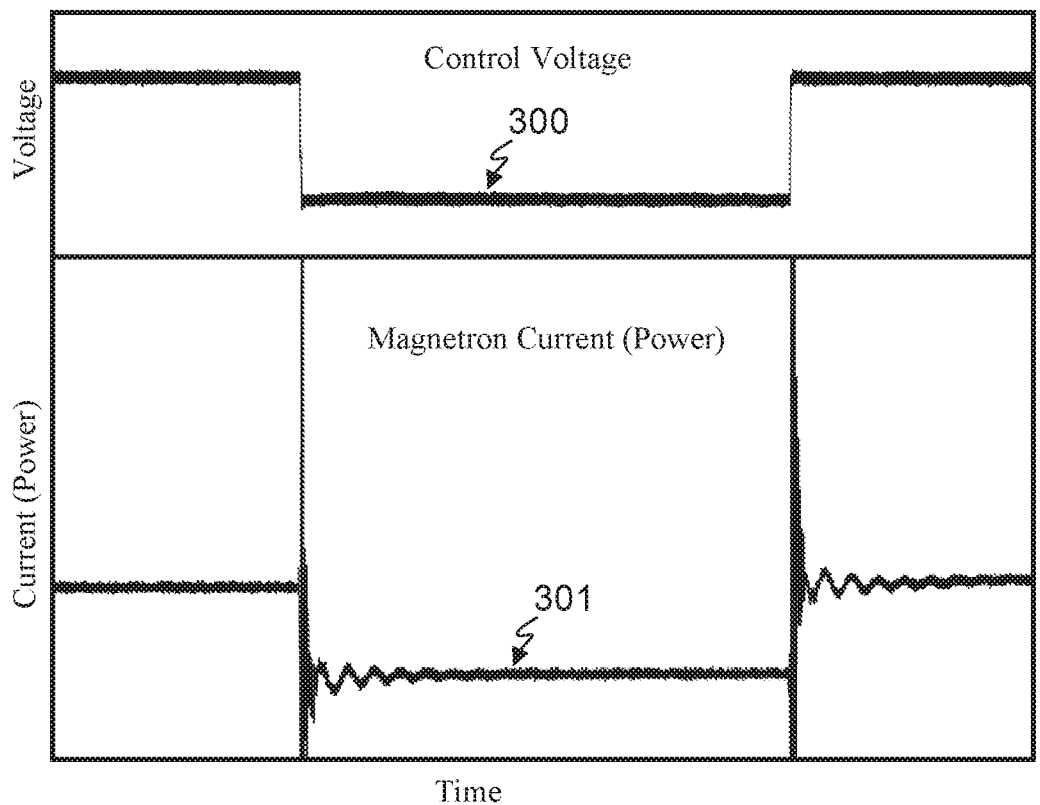
FIG. 3 shows a simplified graph of test results for the example microwave emitter control circuit shown in FIG. 1B, in accordance with some embodiments.

FIG. 3 illustrates test results for an example of the microwave emitter control circuit 140. A control signal trace 300 shows the operation of a relatively high pulsed control voltage applied to a microwave energy source, and a second trace 301 shows the performance of the resulting output current or power of the microwave energy source. The rise and fall times at the transitions for the control signal trace 300 are about 40 nanoseconds. The rapid response of the output current or power trace 301 shows large initial spikes at the rise/fall transitions, but they are insignificant at the time intervals involved, and the rise/fall times of the output current or power trace 301 are of a similar order as those of the control signal trace 300 (e.g., about 100 nanoseconds or less).

Figure 4:
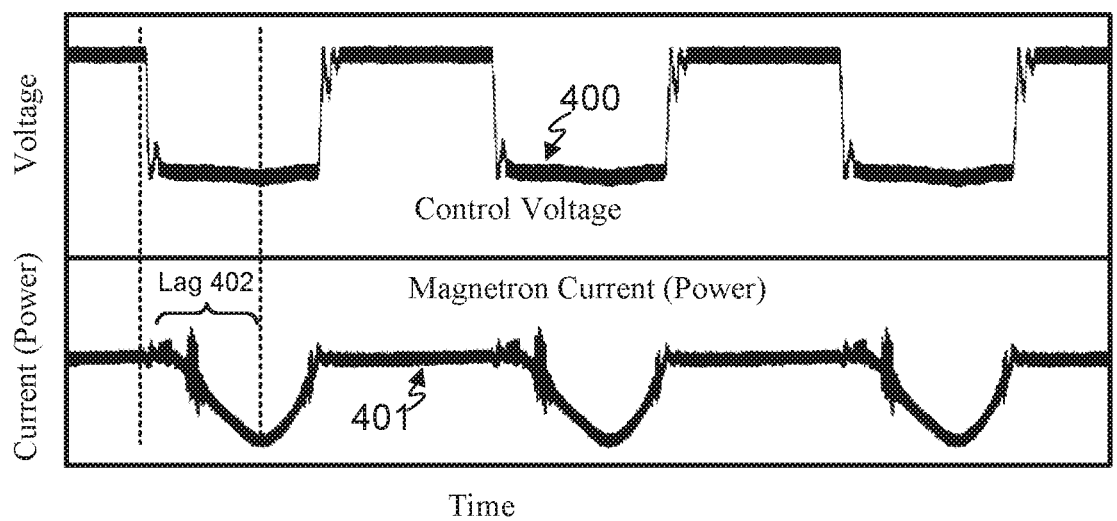
FIG. 4 shows a simplified graph of test results for a prior art microwave emitter control circuit.

FIG. 4 illustrates test results for an example prior art microwave emitter control circuit. A trace 400 shows the operation of a relatively high pulsed control voltage applied to a magnetron, and a second trace 401 shows the performance of the resulting output current or power of the magnetron. The rise and fall times for the control voltage trace 400 are about 4 milliseconds.

The traces 300 and 301 provided in FIG. 3 are shown at a much finer horizontal resolution than are the traces 400 and 401 of FIG. 4, but at about the same vertical resolution. If the traces 300 and 301 of FIG. 3 were presented at the horizontal resolution of FIG. 4, then the initial rise/fall transition spikes in the output current or power trace 301 of the microwave energy source would not have been visible. Instead, the output current or power trace 301 would have appeared as a near perfect square wave, i.e., with no apparent rise/fall time, spikes or ringing. By comparison, however, the prior art output current or power trace 401 shows a substantial response lag 402 and readily apparent ringing. Additionally, the prior art control voltage trace 400 exhibits noticeable ringing. In contrast, the control signal trace 300 for the microwave energy source of the present embodiments has almost no visible ringing, even at the much finer horizontal resolution of FIG. 3.

Figure 5:
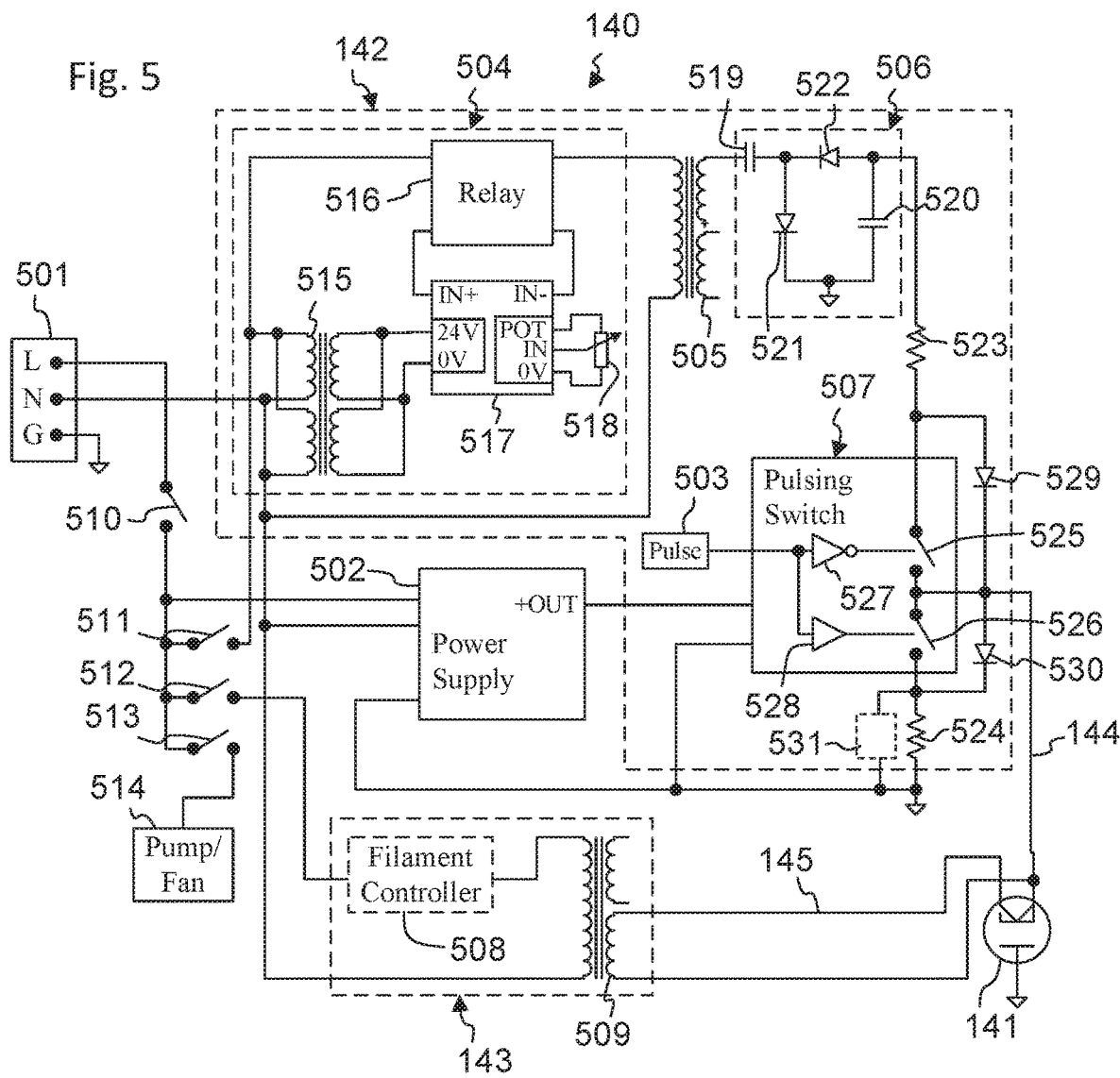
FIG. 5 shows a simplified schematic diagram depicting additional details for the example microwave emitter control circuit shown in FIG. 1B, in accordance with some embodiments.

FIG. 5 shows an example schematic for the microwave emitter control circuit 140, in accordance with some embodiments. The microwave emitter control circuit 140 is generally shown including the microwave energy source 141, the high voltage control circuitry 142, the filament control circuit 143, a voltage input 501, a power supply circuit 502, and pulse generator 503, among other potential circuit components that are either described below or are not shown in this schematic for simplicity. The high voltage control circuitry 142 generally includes a high voltage controller 504, a high voltage power supply (HVPS) transformer 505, a voltage doubler 506, and a pulsing switch 507, among other potential circuit components that are either described below or are not shown for simplicity. The filament control circuit 143 generally includes an optional filament controller 508 and a filament isolation transformer 509, among other potential circuit components not shown for simplicity. Other embodiments may include other components or arrangements of components to achieve similar results in the operation of the microwave energy source 141 (e.g., a microprocessor can be used in place of the high voltage controller 504 to control a waveform provided to the pulsing switch 507).

The microwave emitter control circuit 140 receives an appropriate input AC voltage (e.g., 120 Volts AC) at the voltage input 501 through a voltage line L, a neutral N, and a ground G (i.e., a ground potential). A main control switch 510 connects to the voltage line L to control turning on and off the input AC voltage to the microwave emitter control circuit 140. The main control switch 510 provides the input AC voltage from the voltage line L to the power supply circuit 502. The main control switch 510 provides the input AC voltage from the voltage line L and through additional control switches (e.g., a high voltage control switch 511, a filament control switch 512, a pump/fan control switch 513). When the control switches 510, 511, 512 and 513 are closed, an AC voltage from the voltage line L is supplied to the high voltage controller 504, to the filament control circuit 143, and to a cooling pump or fan 514. The neutral potential N is applied directly to the high voltage controller 504, to the HVPS transformer 505, to the power supply circuit 502, and to the filament control circuit 143.

The high voltage controller 504 generally includes a transformer 515, a relay 516, a relay controller 517, and a potentiometer 518, among other potential circuit components not shown for simplicity. The high voltage controller 504 generally controls the voltage provided to the HVPS transformer 505. To generate the voltage for the HVPS transformer 505, the relay 516 (e.g., a solid state zero crossing relay) receives the input AC voltage through the high voltage control switch 511 and, under control of the relay controller 517, reduces or chops the input AC voltage to some percentage of the original waveform (e.g., 5%-10% of a sine wave), to form a reduced or chopped up sinusoidal AC voltage. The reduced waveform may be as low as 0% and as high as 100% of the original waveform, but in some embodiments, the actual duty cycle range generally depends on properties of the HVPS transformer 505 and the voltage at which the microwave energy source 141 operates. A setting of the potentiometer 518 determines the percentage of the original waveform of the input AC voltage that passes through the relay 516. The transformer 515 receives the input AC voltage and the neutral N to generate a voltage (e.g., 24 Volts) to power the relay controller 517.

The HVPS transformer 505 (e.g., a step-up transformer) receives the neutral N and the chopped up AC voltage. With this voltage, the HVPS transformer 505 generates an intermediate high voltage (e.g., from about zero Volts to about 10,000 Volts). The level of the intermediate high voltage is based on the percentage of the original sine wave of the input AC voltage that passes the relay 516, which is adjusted by setting the potentiometer 518. The waveform of the intermediate high voltage is averaged out by the HVPS transformer 505.

The voltage doubler 506 generally includes capacitor 519, capacitor 520 as well as diode 521 and diode 522 connected to each other and to ground as shown. The voltage doubler 506 receives the intermediate high voltage generated by the HVPS transformer 505 and doubles it to form a high voltage (e.g., of about 3-15 kilovolts, depending on the output power requirements for the microwave energy source 141). The high voltage is passed through a high side resistor 523 to a high side input, or high voltage connection point, of the pulsing switch 507 to be provided to the microwave energy source 141 with each pulse.

The power supply circuit 502 is any appropriate AC-DC power converter that receives the input AC voltage, the neutral N, and the ground. The power supply circuit 502 generates a DC drive voltage (+out). A pulse generator 503 provides a signal to the pulsing switch 507.

The pulse generator 503 is any appropriate internal or external function generator capable of generating a changeable pulse control signal. The pulse control signal is at the desired frequency and duty cycle mentioned above to produce microwave power at a pulsing frequency, duty cycle, shape, and output power level that is appropriate for the particular application. In some embodiments, the pulse generator 503 is controlled by a computer, an analog input, manually, or other appropriate control technique in order to set the frequency and duty cycle of the pulse control signal.

The pulsing switch 507 is connected to the power supply circuit 502 to receive the DC drive voltage (+out), and connected to the pulse generator 503 to receive the pulse control signal. The pulsing switch 507 is also connected to the high side resistor 523 to receive the high voltage provided by the voltage doubler 506, and is further connected through a low side resistor 524 to a path to ground. The pulsing switch 507 is any appropriate switching device and may include vacuum relays, power MOSFETs, IGBTs or other switch components. For example, the series HTS-GSM switching modules available from Behlke Power Electronics GmbH of Kronberg, Germany, or other appropriate push-pull circuit, may be used for the pulsing switch 507. In some embodiments, the pulsing switch 507 generally includes high side bi-polar active switch 525 and low side bi-polar active switch 526 and corresponding switch drivers (e.g., switch driver 527 and switch driver 528). In some embodiments, the bi-polar active switches are relatively sensitive semiconductor or vacuum tube switches with relatively consistent hysteresis for switchpoints. In some embodiments, both the bi-polar active switch 525 and the bi-polar active switch 526 are connected in series between the high voltage connection and the ground connection (i.e., high voltage conductor and ground conductor). The pulsed high voltage output 144 is produced from a node between the bi-polar active switches, such that bi-polar active switch 525 provides a positive power supply to the microwave energy source 141, whereas the bi-polar active switch 526 quickly shunts the power back out to a lower level.

The DC drive voltage (+out) powers the switch drivers 527 and 528. The switch drivers 527 and 528 drive the bi-polar active switches 525 and 526, respectively. The bi-polar active switches 525 and 526 are turned on and off according to the frequency and duty cycle of the pulse control signal received from the pulse generator 503. The high side switch driver 527 generates an inverted drive signal compared to that of the low side switch driver 528, so that the bi-polar active switches 525 and 526 are activated and deactivated in a complementary manner. Diode 529 (connected from the high side high voltage input to a pulsed high voltage output of the pulsing switch 507) and diode 530 (connected from the pulsed high voltage output to the low side, or ground, connection through the resistor 524) provide electrical protection for the pulsing switch 507.

When the bi-polar active switch 525 is closed, the bi-polar active switch 526 is opened, and the high voltage is rapidly applied at the pulsed high voltage output (e.g., the pulsed high voltage output 144) to the microwave energy source 141 as described above to cause the microwave energy source 141 to start oscillating and producing the microwave radiation. The direct application of the high voltage to the microwave energy source 141 causes the rapid rise response (e.g., a range of about 20-50 nanoseconds, or a value of about 40 nanoseconds) in the current or power output of the microwave energy source 141 described above with respect to FIG. 3. Setting the potentiometer 518 adjusts the current or power output level due to the corresponding adjustment in the high voltage level.

When the bi-polar active switch 526 is closed, the bi-polar active switch 525 is opened, and the pulsed high voltage output of the pulsing switch 507 is connected to the ground connection through the resistor 524 directly to ground. In this manner, the output voltage is rapidly shunted off to a low voltage level (determined by the resistor 524 and a reactive component 531). This rapid shunting of the output voltage and its corresponding fast quenching effect on the circulating electron cloud is referred to herein as the "quenching technique." In some embodiments, the aforementioned "quenching technique" is implemented using reactive component 531, which introduces a capacitive sink (e.g., a charge sink) and/or an inductive load across the resistor 524. Alternatively, in some embodiments, the reactive component 531 is placed directly across the output of the bi-polar active switches 525 and 526. In some embodiments, a relatively small power supply component is used in addition to, or in place of the reactive component 531 to hold the voltage at the node between the bi-polar active switches 525 and 526 at a simmer level.

The microwave energy source 141 still has latent power at this point in the form of a circulating electron cloud inside it as it is producing microwaves. This latent power is shunted to a low level to rapidly quench the circulating electron cloud, thereby causing the rapid fall response (e.g., a range of about 20-50 nanoseconds, or a value of about 40 nanoseconds) in the current or power output of the microwave energy source 141 described above with respect to FIG. 3. A pulsed high voltage is thus produced at the pulsed high voltage output 144 as the bi-polar active switches 525 and 526 are repeatedly pulsed on and off to alternatingly connect the pulsed high voltage output back and forth between the high voltage connection and a relatively lower voltage level. That is, the pulsed voltage output is shunted to the ground through the second bi-polar active switch, the pulsed voltage output being capable of collapsing a circulating electron cloud in cavities of the magnetron ring, which will consequently shut down the generation of microwave energy. The pulsed high voltage has a frequency and duty cycle based on the frequency and duty cycle of the pulse control signal received from the pulse generator 503.

The filament isolation transformer 509 provides power to the filament of the microwave energy source 141. For embodiments without the filament controller 508, the filament isolation transformer 509 is driven directly by the input AC voltage received from the voltage input 501. The output current or power level of the microwave energy source 141, as described above, is dependent on, or controlled by, the high voltage (and the pulsing frequency and pulsing duty cycle thereof) received through the pulsing switch 507 and the filament current. In this case without the filament controller 508, therefore, the output current or power level of the microwave energy source 141 is controlled by only the high voltage received through the pulsing switch 507, since the filament current is constant. For embodiments with the filament controller 508, on the other hand, the AC voltage applied to the filament isolation transformer 509 can be adjusted or controlled by the filament controller 508. In this case, the filament controller 508 controls the amount of current or voltage to the filament of the microwave energy source 141, thereby providing an additional, relatively coarse, control for the output current or power level of the microwave energy source 141. Control of the filament current may shift the location of the on point 206 in FIG. 2.

In some embodiments, an electronic circuit includes a high voltage generator that produces a high voltage, a pulse generator that produces a pulse control signal having a frequency and a duty cycle, and a pulsing switch. The electronic circuit may be used with an energy source that generates energy of various frequencies, such as a microwave energy source. In the embodiment of microwave energy, the electronic circuit serves as a microwave emitter control circuit for the microwave energy source where the microwave energy source generates pulsed microwave radiation when receiving a pulsed high voltage, and where a power level of the pulsed microwave radiation depends on a voltage level, a frequency, and a duty cycle of the pulsed high voltage. In general embodiments, the pulsing switch has a first bi-polar active switch, a second bi-polar active switch, a high voltage connection, a ground connection, a pulse input, and a pulsed voltage output. The first bi-polar active switch and the second bi-polar active switch are connected in series between the high voltage connection and the ground connection. The high voltage connection is connected to the high voltage generator to receive the high voltage. The ground connection is connected to a ground potential. The pulsed voltage output is connected between the first bi-polar active switch and the second bi-polar active switch. The pulse input is connected to the pulse generator to receive the pulse control signal. The pulsed high voltage is produced at the pulsed voltage output when the first bi-polar active switch and the second bi-polar active switch are repeatedly pulsed on and off to alternatingly connect the pulsed voltage output back and forth between the high voltage connection and the ground connection. The frequency and the duty cycle of the pulsed high voltage is based on the frequency and the duty cycle of the pulse control signal.

In some embodiments, a microwave emitter control circuit includes a microwave energy source, a high voltage generator that produces a high voltage, a pulse generator that produces a pulse control signal having a frequency and a duty cycle, and a pulsing switch. The microwave energy source generates pulsed microwave radiation when receiving a pulsed high voltage, where a power level of the pulsed microwave radiation depends on a voltage level, a frequency, and a duty cycle of the pulsed high voltage. The pulsing switch has a first bi-polar active switch, a second bi-polar active switch, a high voltage connection, a ground connection, a pulse input, and a pulsed voltage output. The first bi-polar active switch and the second bi-polar active switch are connected in series between the high voltage connection and the ground connection. The high voltage connection is connected to the high voltage generator to receive the high voltage. The ground connection is connected to a ground potential. The pulsed voltage output is connected between the first bi-polar active switch and the second bi-polar active switch. The pulse input is connected to the pulse generator to receive the pulse control signal. The pulsed high voltage is produced at the pulsed voltage output with rise and fall times of 20-50 nanoseconds when the first bi-polar active switch and the second bi-polar active switch are repeatedly pulsed on and off to alternatingly connect the pulsed voltage output back and forth between the high voltage connection and the ground connection. The frequency and the duty cycle of the pulsed high voltage is based on the frequency and the duty cycle of the pulse control signal. When the pulsed microwave radiation is pulsed off, the microwave energy source is held at a nonzero voltage level below an oscillating region. The pulsed voltage output is shunted to the ground potential through the second bi-polar active switch, the pulsed voltage output being capable of collapsing a circulating electron cloud.

In some embodiments, an apparatus comprises an electronic circuit configured to generate a high voltage having a voltage level and generate a pulse control signal having a frequency and a duty cycle. The electronic circuit is also configured to generate, by a pulsing switch, a pulsed high voltage from the high voltage and the pulse control signal, the pulsed high voltage having the voltage level, the frequency and the duty cycle, the pulsing switch having a first bi-polar active switch, a second bi-polar active switch, a high voltage connection, a ground connection, a pulse input, and a pulsed voltage output, wherein the first bi-polar active switch and the second bi-polar active switch are connected in series between the high voltage connection and the ground connection, the high voltage connection receives the high voltage, the ground connection is connected to a ground potential, the pulsed voltage output is connected between the first bi-polar active switch and the second bi-polar active switch, the pulse input receives the pulse control signal, and the pulsed high voltage is produced at the pulsed voltage output when the first bi-polar active switch and the second bi-polar active switch are repeatedly pulsed on and off to alternatingly connect the pulsed voltage output back and forth between the high voltage connection and the ground connection. The electronic circuit is also configured to generate a pulsed microwave radiation having a power level that depends on the voltage level, the frequency and the duty cycle.

In some embodiments, an apparatus includes an energy source, a high voltage generator that produces a high voltage on a high voltage connection, a pulse generator that produces a pulse control signal having a pulse control frequency and a pulse control duty cycle, and a pulsing switch. The energy source may be, for example, a microwave energy source. The energy source generates pulsed radiation (e.g., microwave radiation) when receiving a pulsed high voltage, where a power level of the pulsed radiation depends on a voltage level, a frequency, and a duty cycle of the pulsed high voltage. The pulsing switch has a first bi-polar active switch, a second bi-polar active switch, a high voltage connection, a ground connection, a pulse input, and a pulsed voltage output. When a voltage at the high voltage connection transitions from a higher voltage to a lower voltage, the power level of the pulsed microwave radiation transitions from a higher power level to a lower power level (i.e., from a first power level to a second power level that is lower than the first power level) within a range of about 20 nanoseconds to about 50 nanoseconds.

Figure 6:
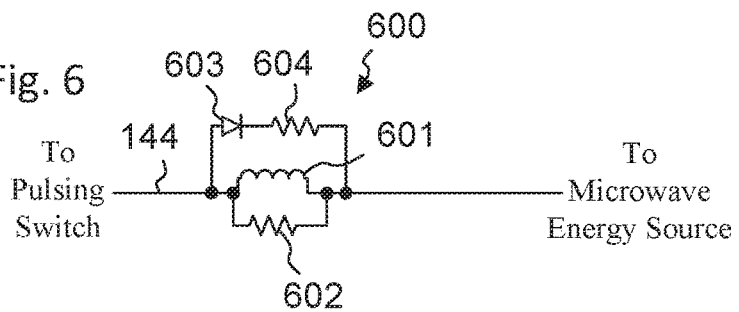
FIG. 6 shows a simplified schematic diagram of a rise time adjustment network circuit for use with the microwave emitter control circuit shown in FIGS. 1B and 5, in accordance with some embodiments.

FIG. 6 shows an optional rise time adjustment network 600 for tuning the rise and fall times of the pulsed high voltage output 144 for applications of the microwave emitter control circuit 140 that has, for example, a reactor or chemistry that requires some extra rise time. The rise time adjustment network 600 generally includes a parallel arrangement of an inductor 601, a resistor 602, and a series diode/resistor (603/604) that can slow the rise and fall times of the pulsed high voltage output 144. The rise time adjustment network 600, thus, can be placed between the pulsing switch 507 and the microwave energy source to put a more controllable slope in the transitions of the square wave of the control signal trace 300, so as to smooth out, or reduce, the spikes or ringing, and to put a curve in the transitions of the output current or power trace 301 shown in FIG. 3. In this manner, rise time adjustment network 600 smooths out the ringing or provides a controlled rise time in the output current or power trace 301 to smooth out, or otherwise shape the overall waveform.

Figure 7:
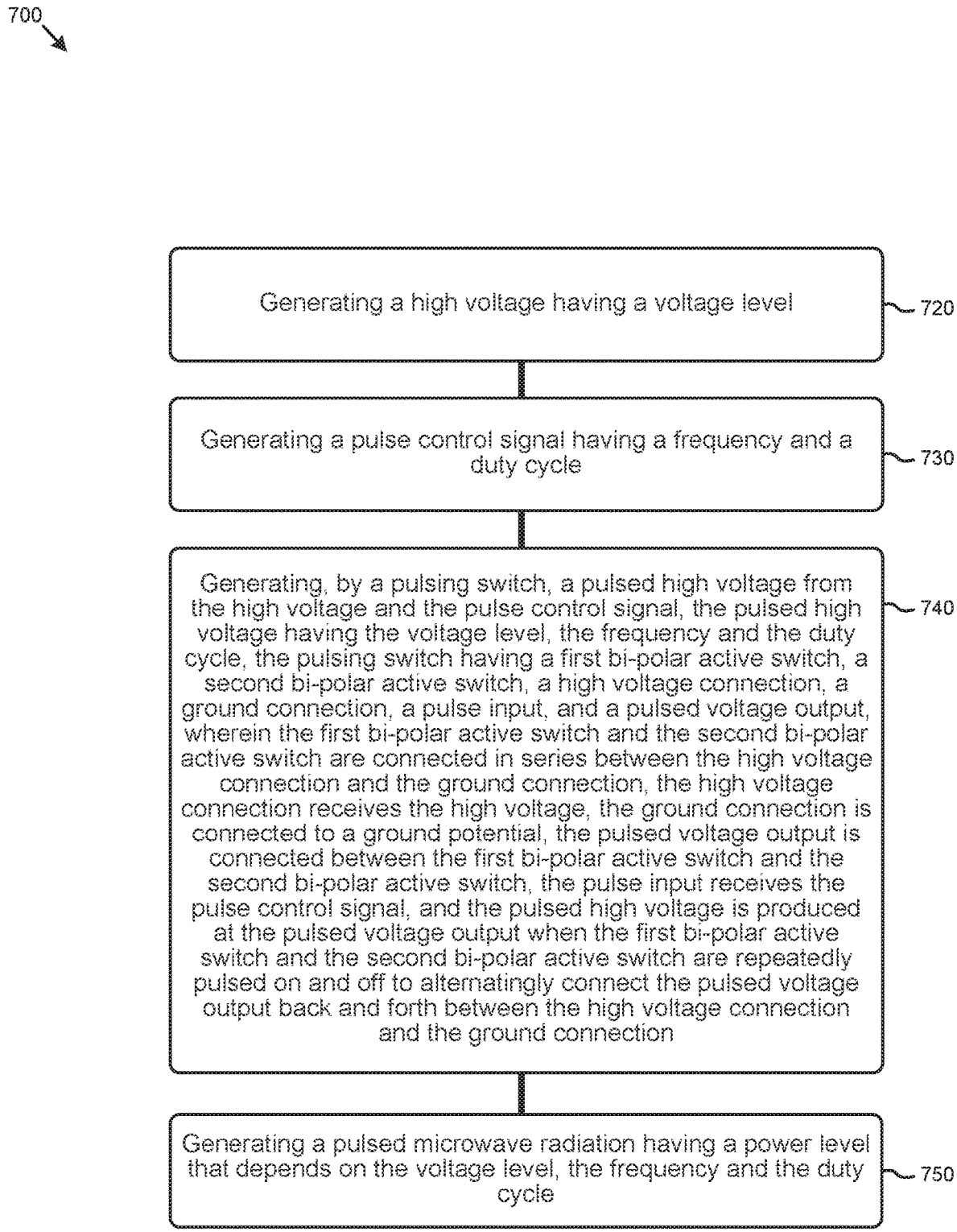
FIG. 7 is a flowchart of methods for generating microwave radiation using a microwave emitter control circuit, in accordance with some embodiments.

FIG. 7 (flowchart 700) depicts method steps that can be carried out by operation of an electronic circuit (e.g., microwave emitter control circuit) as described herein. The shown embodiment implements method steps comprising: generating a high voltage having a voltage level (module 720); generating a pulse control signal having a frequency and a duty cycle (module 730); generating, by a pulsing switch, a pulsed high voltage from the high voltage and the pulse control signal, the pulsed high voltage having the voltage level, the frequency and the duty cycle, the pulsing switch having a first bi-polar active switch, a second bi-polar active switch, a high voltage connection, a ground connection, a pulse input, and a pulsed voltage output, wherein the first bi-polar active switch and the second bi-polar active switch are connected in series between the high voltage connection and the ground connection. The high voltage connection receives the high voltage, the ground connection is connected to a ground potential, the pulsed voltage output is connected between the first bi-polar active switch and the second bi-polar active switch, the pulse input receives the pulse control signal, and the pulsed high voltage is produced at the pulsed voltage output when the first bi-polar active switch and the second bi-polar active switch are repeatedly pulsed on and off to alternatingly connect the pulsed voltage output back and forth between the high voltage connection and the ground connection (module 740). The method also includes generating a pulsed microwave radiation having a power level that depends on the voltage level, the frequency and the duty cycle (module 750).

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention. Furthermore, those of ordinary skill in the art will appreciate that the foregoing description is by way of example only, and is not intended to limit the invention.

What is claimed is:

1. A circuit comprising:
    a microwave energy source configured to generate a pulsed radiation having an on state and an off state;
    a voltage generator configured to apply a non-zero voltage to the microwave energy source during at least the off state of the pulsed radiation;
    a generator configured to produce a control signal with a frequency and a duty cycle;
    a voltage input terminal coupled to a power supply circuit;
    an output terminal coupled to the microwave energy source; and
    a switch coupled to the voltage input terminal and the output terminal and comprising a first bi-polar active switch and a second bi-polar active switch connected in series between a voltage connection and a ground, wherein the frequency and the duty cycle of the non-zero voltage is based on the frequency and the duty cycle of the control signal.

2. The circuit of claim 1, wherein the non-zero voltage has a rise time within a range of about 20 nanoseconds to about 50 nanoseconds.

3. The circuit of claim 1, wherein the non-zero voltage has a fall time within a range of about 20 nanoseconds to about 50 nanoseconds.

4. The circuit of claim 1, wherein the pulsed radiation is based at least in part on the non-zero voltage.

5. The circuit of claim 1, wherein the second bi-polar active switch is configured to shunt an output voltage to the ground.

6. The circuit of claim 4, further comprising a filament control circuit configured to provide a switching capability for controlling dissociation dynamics of a process gas.

7. The circuit of claim 1, wherein a power level of the radiation is controlled by adjusting the voltage of the voltage generator.

8. The circuit of claim 1, further comprising an energy source including any one or more of a magnetron, a klystron, or a traveling wave guide.

9. The circuit of claim 1, wherein the non-zero voltage is produced at the voltage output when the first bi-polar active switch and the second bi-polar active switch are pulsed.

10. A method comprising:
    generating a pulsed radiation from a microwave energy source having an on state and an off state based on a control signal;
    applying a non-zero voltage to the microwave energy source during the off state of the pulsed radiation; and
    producing a control signal with a frequency and a duty cycle, wherein the frequency and the duty cycle of the voltage is based on a frequency and a duty cycle of the control signal.

11. The method of claim 10, further comprising pulsing the non-zero voltage with a rise time within a range of about 20 nanoseconds to about 50 nanoseconds.

12. The method of claim 10, further comprising pulsing the non-zero voltage with a fall time within a range of about 20 nanoseconds to about 50 nanoseconds.

13. The method of claim 10, further comprising collapsing a circulating electron cloud by shunting the non-zero voltage output.

14. The method of claim 10, further comprising:
    providing a current to a filament of a microwave energy source; and
    controlling a power level of the microwave radiation by adjusting the non-zero voltage and the current to the filament.

15. The method of claim 10, further comprising generating the microwave radiation by one of a magnetron, a klystron, or a traveling wave guide.

\* \* \* \* \*